United States Patent
Shin

(10) Patent No.: US 10,191,692 B2
(45) Date of Patent: Jan. 29, 2019

(54) MEMORY DEVICE AND METHOD OF OPERATING THE SAME

(71) Applicant: SK hynix Inc., Gyeonggi-do (KR)

(72) Inventor: Beom Ju Shin, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 64 days.

(21) Appl. No.: 15/183,183

(22) Filed: Jun. 15, 2016

(65) Prior Publication Data

US 2017/0206037 A1    Jul. 20, 2017

(30) Foreign Application Priority Data

Jan. 18, 2016  (KR) ........................ 10-2016-0006070

(51) Int. Cl.
| | | |
|---|---|---|
| *G06F 12/00* | (2006.01) | |
| *G06F 3/06* | (2006.01) | |
| *G11C 7/10* | (2006.01) | |
| *G11C 8/06* | (2006.01) | |
| *G11C 16/04* | (2006.01) | |

(52) U.S. Cl.
CPC .......... *G06F 3/0659* (2013.01); *G06F 3/0604* (2013.01); *G06F 3/0653* (2013.01); *G06F 3/0688* (2013.01); *G11C 7/10* (2013.01); *G11C 7/1063* (2013.01); *G11C 8/06* (2013.01); *G11C 16/0483* (2013.01)

(58) Field of Classification Search
CPC .... G06F 3/0659; G06F 3/0604; G06F 3/0688; G06F 3/0653
See application file for complete search history.

(56) References Cited

U.S. PATENT DOCUMENTS

| | | | |
|---|---|---|---|
| 5,930,818 A * | 7/1999 | Suu ................... | G06F 17/30569 707/E17.006 |
| 8,151,039 B2 | 4/2012 | Lai et al. | |
| 2002/0069381 A1* | 6/2002 | Jeong .................... | G11C 29/40 714/704 |
| 2004/0148482 A1* | 7/2004 | Grundy ................. | G06F 12/06 711/167 |
| 2007/0002635 A1* | 1/2007 | Nakamura ............ | G11C 7/065 365/189.15 |
| 2009/0043932 A1* | 2/2009 | Bernardi ................ | G11C 5/04 710/110 |
| 2010/0049905 A1* | 2/2010 | Ouchi .................. | G06F 1/3225 711/103 |
| 2011/0239009 A1* | 9/2011 | Noda .................... | G06F 13/385 713/300 |
| 2011/0276775 A1* | 11/2011 | Schuetz ............. | G06F 13/1673 711/165 |
| 2012/0210157 A1* | 8/2012 | Wang .................. | G06F 13/4243 713/500 |
| 2013/0016577 A1* | 1/2013 | Nagadomi .......... | G11C 11/5628 365/218 |

(Continued)

*Primary Examiner* — Prasith Thammavong
(74) *Attorney, Agent, or Firm* — IP & T Group LLP

(57) ABSTRACT

Disclosed herein is a memory system including: a plurality of memory chips coupled to a plurality of input/output lines included in a channel and output ready/busy signals to the input/output lines in response to a status check command; and a memory controller configured to transmit the status check command to the memory chips through the channel and simultaneously determine an operation status of the memory chips depending on the ready/busy signals received through the input/output lines.

19 Claims, 8 Drawing Sheets

(56) References Cited

U.S. PATENT DOCUMENTS

| | | |
|---|---|---|
| 2014/0250262 A1 | 9/2014 | Buxton et al. |
| 2015/0120990 A1* | 4/2015 | Chu ...................... G06F 3/0659 711/103 |
| 2015/0187399 A1 | 7/2015 | Tuers et al. |
| 2016/0246514 A1* | 8/2016 | Nosaka ................. G06F 3/0611 |
| 2016/0358657 A1* | 12/2016 | Kim ....................... G11C 16/10 |

* cited by examiner

MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0006070 filed on Jan. 18, 2016 which is incorporated herein in its entirety by reference.

BACKGROUND

1. Field

Various embodiments of the present disclosure relate generally to a memory system having a memory chip and a memory controller coupled to each other through a channel.

2. Description of Related Art

A memory system has been widely used as a data storage for digital devices such as, for example, a computer, a digital camera, an MP3 player, and a smart phone. The memory system may include a memory device in which data are stored and a memory controller controlling the memory device. If the digital devices are a host, the memory controller may transmit a variety of information including a command and data between the host and the memory device.

In recent years, with the improvement in portability of the digital devices, data usage is gradually increasing. To accommodate the increase in the data usage, a memory device may typically include a plurality of memory chips which communicate with a memory controller through a channel. For example, the plurality of memory chips may be coupled to one channel and the memory system may include a plurality of channels.

SUMMARY

Various embodiments of the present disclosure are directed to a memory system with reduced channel size and increased operation speed.

One embodiment of the present disclosure provides a memory system including: a memory chip configured to output ready/busy signals in response to a status check command; and a memory controller configured to transmit the status check command to the memory chip through input/output lines coupled to the memory chip and determine an operation status of the memory chip depending on the ready/busy signals received through the input/output lines.

Another embodiment of the present disclosure provides a memory system including: a plurality of memory chips coupled to a plurality of input/output lines included in a channel and configured to output ready/busy signals to the input/output lines in response to a status check command; and a memory controller configured to transmit the status check command to the memory chips through the channel and simultaneously determine an operation status of the memory chips depending on the ready/busy signals received through the input/output lines.

Yet another embodiment of the present disclosure provides a memory system including: a plurality of memory chips divided into a plurality of memory groups, commonly coupled to a plurality of input/output lines, and configured to selectively output ready/busy signals to the input/output lines for each group; and a memory controller configured to simultaneously determine an operating status of the memory chips depending on the ready/busy signals received in the group unit.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Hereinafter, embodiments of the present disclosure will be described with reference to the accompanying drawings. The embodiments of the present disclosure are not limited to the following embodiments and may be implemented in various different forms. The present embodiments are intended to make the description of the present disclosure complete, and are provided to fully describe the present disclosure to a person having ordinary knowledge in the art to which the present invention pertains.

Figure 1:
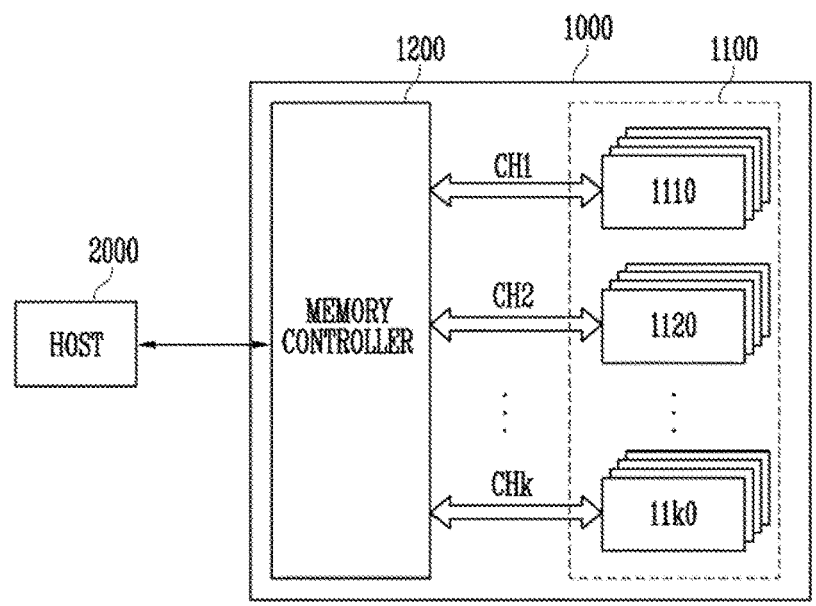
FIG. 1 is a diagram of a memory system, according to an embodiment of the present invention.

FIG. 1 illustrates a memory system 1000, according to an embodiment of the present invention.

Referring to FIG. 1, the memory system 1000 may include a memory device 1100 in which data are stored, and a memory controller 1200 controlling the memory device 1100.

The memory device 1100 may include a plurality of memory chip groups 1110 to 11$k$0. The memory chip groups 1110 to 11$k$0 may communicate with the memory controller 1200 through channels CH1 to CHk (k is a positive integer). Each of the memory chip groups 1110 to 11$k$0 may include a plurality of memory chips.

The memory controller 1200 may control the memory chips included in the memory chip groups 1110 to 11$k$0 in response to a command provided from a host 2000 through the channels CH1 to CHk.

The memory controller 1200 may perform status check operations for identifying which of the memory chips is available, prior to controlling the memory chips. For example, the memory controller 1200 may identify available memory chips according to ready/busy signals output from the memory chips. When the available memory chip is identified, the memory controller 1200 may select any one of the available memory chips and control operation of the selected memory chip. During the status check operations, the memory controller 1200 may determine the status of one memory chip coupled to a selected channel or may simultaneously determine the status of a plurality of memory chips coupled to the selected channel.

Figure 2:
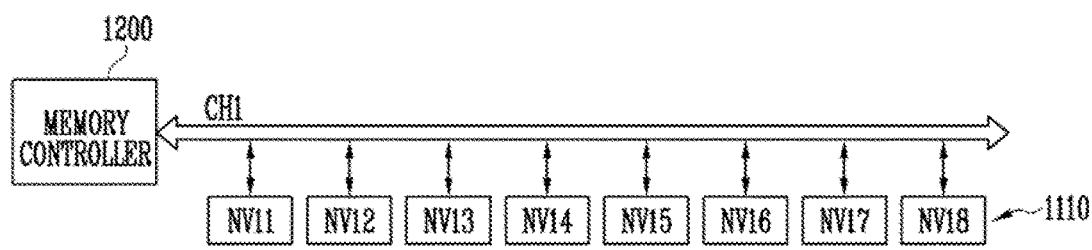
FIG. 2 is a diagram describing a connection relationship between a memory controller and a plurality of memory chips.

FIG. 2 illustrates the connection relationship between the first memory chip group 1110 of the memory chip groups 1110 to 11$k$0 illustrated in FIG. 1 and the memory controller 1200. Like the first memory chip group 1110 illustrated in FIG. 2, the rest memory chip groups 1120 to 11$k$0 (FIG. 1) may also be coupled to the memory controller 1200 through the channels.

The first memory chip group 1110 may include a plurality of memory chips NV11 to NV18 that are commonly coupled to a first channel CH1. FIG. 2 illustrates as an example for illustration purposes 8 memory chips NV11 to NV18. However, we note that the memory system may include a larger or smaller number of memory chips per chip group. The memory chips NV11 to NV18 may be implemented as a volatile memory device or a non-volatile memory device. In an embodiment, the memory chips NV11 to NV18 may be implemented as a non-volatile memory device in which data may be maintained even though a supply of power is shut off. For example, the memory chips NV11 to NV18 may include NAND flash memory devices.

For the memory controller 1200 and the memory chips included in the first memory chip group 1110 to exchange a variety of information through the first channel CH1, a plurality of lines are included in the first channel CH1. The first channel CH1 will be described below in more detail.

Figure 3:
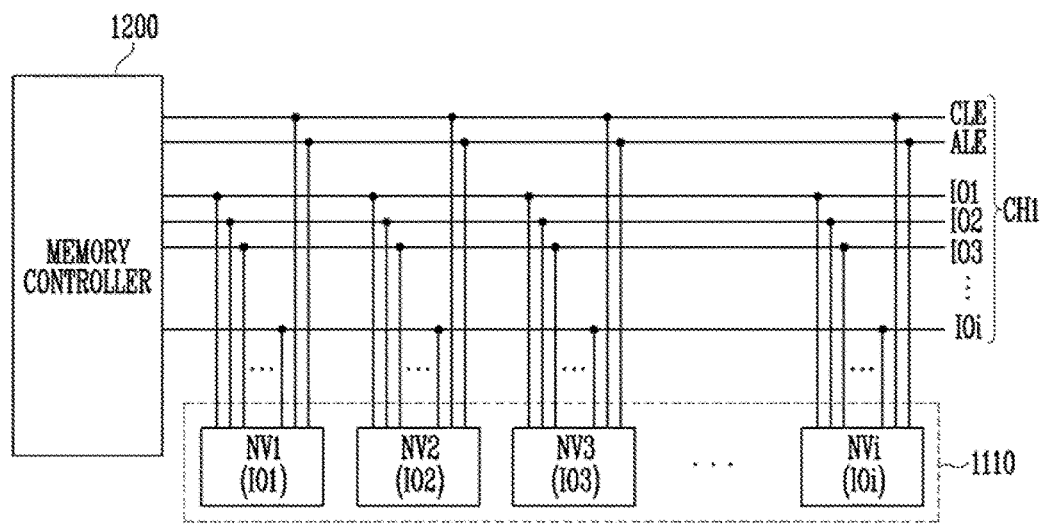
FIG. 3 is a diagram describing a connection relationship between a channel and a plurality of memory chips, according to an embodiment of the present invention.

FIG. 3 is a diagram describing the connection relationship between the channel and the memory chips according to the embodiment of the present invention. FIG. 3 exemplifies memory chips NV1 to NVi (i is a positive integer) coupled to the first channel CH1.

Referring to FIG. 3, the first channel CH1 may include a line to which a command latch enable signal (CLE) is applied, a line to which an address latch enable signal (ALE) is applied, and a plurality of input/output lines IO1 to IO$i$.

Although not illustrated in FIG. 3, in addition to the foregoing lines, the first channel CH1 may further include lines to which a chip enable signal, a write enable signal, a read enable signal, and a write protect signal, respectively, are applied. For example, when the selected memory chip is in a ready state, the chip enable signal may be used to enter the selected memory chip into a standby mode. Further, the chip enable signal may be applied to the selected memory chip(s) through the selected chip enable line(s) among the chip enable lines coupled to each of the memory chips NV1 to NVi. For example, during the status check operation for checking the status of the memory chip a chip enable signal may be enabled for the selected memory chip and the chip enable signal may be disabled for the rest non-selected memory chips. Alternatively, when the status check operation for checking the status of the memory chip is performed to all the memory chips, all of the chip enable signals for all the memory chips may be enabled or disabled. The command latch enable signal CLE may be used to load a command on the selected one among the memory chips NV1 to NVi. The address latch enable signal ALE may be used to load an address on the selected one among the memory chips NV1 to NVi or load a group ID for selecting the grouped memory chips on the memory chips NV1 to NVi. The read enable signal may be used to output data from the selected memory chip. The write protect signal may be used to protect the memory chip when a program operation or a deletion operation is suddenly performed.

The command, the address, and the data may be transmitted from the memory controller 1200 to the selected memory chip through the input/output lines IO1 to IO$i$. For example, the command, the address, and the data may be transmitted to one or more memory chips selected from the memory chips NV1 to NVi through the input/output lines IO1 to IO$i$ that are commonly coupled to the memory chips NV1 to NVi.

A ready/busy signal in which the status information on the memory chips NV1 to NVi is included may be transmitted from the memory chips NV1 to NVi to the memory controller 1200 through the input/output lines IO1 to IO$i$. For the status check operation, the input/output lines IO1 to IO$i$ may be set to respectively correspond to the memory chips NV1 to NVi. For example, the ready/busy signal of the first memory chip NV1 may be set to be transmitted to the memory controller 1200 through the first input/output line IO1 and the ready/busy signal of the second memory chip NV2 may be set to be transmitted to the memory controller 1200 through the second input/output line IO2. In this way, the ready/busy signal of the n-th ($1 \leq n \leq i$) memory chip NVn may be set to be transmitted to the memory controller 1200 through the n-th input/output line IO.

For this purpose, the memory controller 1200 may store information on the memory chips NV1 to NVi respectively corresponding to the first to i-th input/output lines IO1 to IOi and determine the status of the first to i-th memory chips NV1 to NVi according to the ready/busy signals transmitted through the first to i-th input/output lines IO1 to IOi during the status check operation. A configuration of the memory controller 1200 will be described below in detail.

Figure 4:
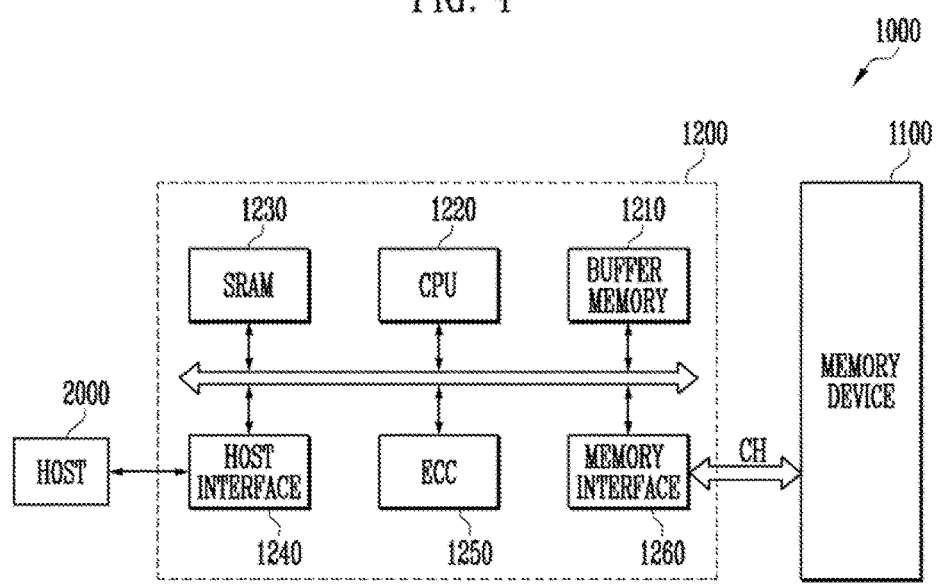
FIG. 4 is a diagram describing an example configuration of a memory controller, according to an embodiment of the present invention.

FIG. 4 is a diagram describing in more detail the memory controller 1200.

Referring to FIG. 4, a memory system 1000 may include the memory device 1100 in which data are stored and the memory controller 1200 controlling the memory device 1100. The memory controller 1200 may include a buffer memory 1210, a CPU 1220, an SRAM 1230, a host interface 1240, an ECC 1250, and a memory interface 1260 for controlling communication between the host 2000 and the memory device 1100.

The buffer memory 1210 may temporarily store a variety of information required for the operation of the memory controller 1200. For example, the buffer memory 1210 may store matching information of the first to i-th input/output lines IO1 to IOi and the first to i-th memory chips NV1 to NVi which are required for the status check operation.

The CPU 1220 may perform various operations for controlling the memory device 110 or generate the command and the address. For example, the CPU 1220 may generate a status check command for the status check operation and generate the group ID for selecting a memory chip group when the memory chips are grouped. Further, the CPU 1220 may determine the status of the first to i-th memory chips NV1 to NVi depending on the ready/busy signals transmitted through the first to i-th input/output lines IO1 to IOi and may determine an operation order of the selected memory chips or generate the command for controlling the operation of the selected memory chip according to the determined result.

The SRAM 1230 may be used as a working memory of the CPU 1220.

The host interface 1240 may include a data exchange protocol of the host 2000 that is coupled to a memory system 1000.

The ECC 1250 is an error corrector and may detect or correct an error included in data read from the memory device 1100.

The memory interface 1260 may be coupled to the memory device 1100 through the channel CH and interface with the memory device 1100.

Next, a configuration of the memory chip included in the memory device 1100 will be described.

Figure 5:
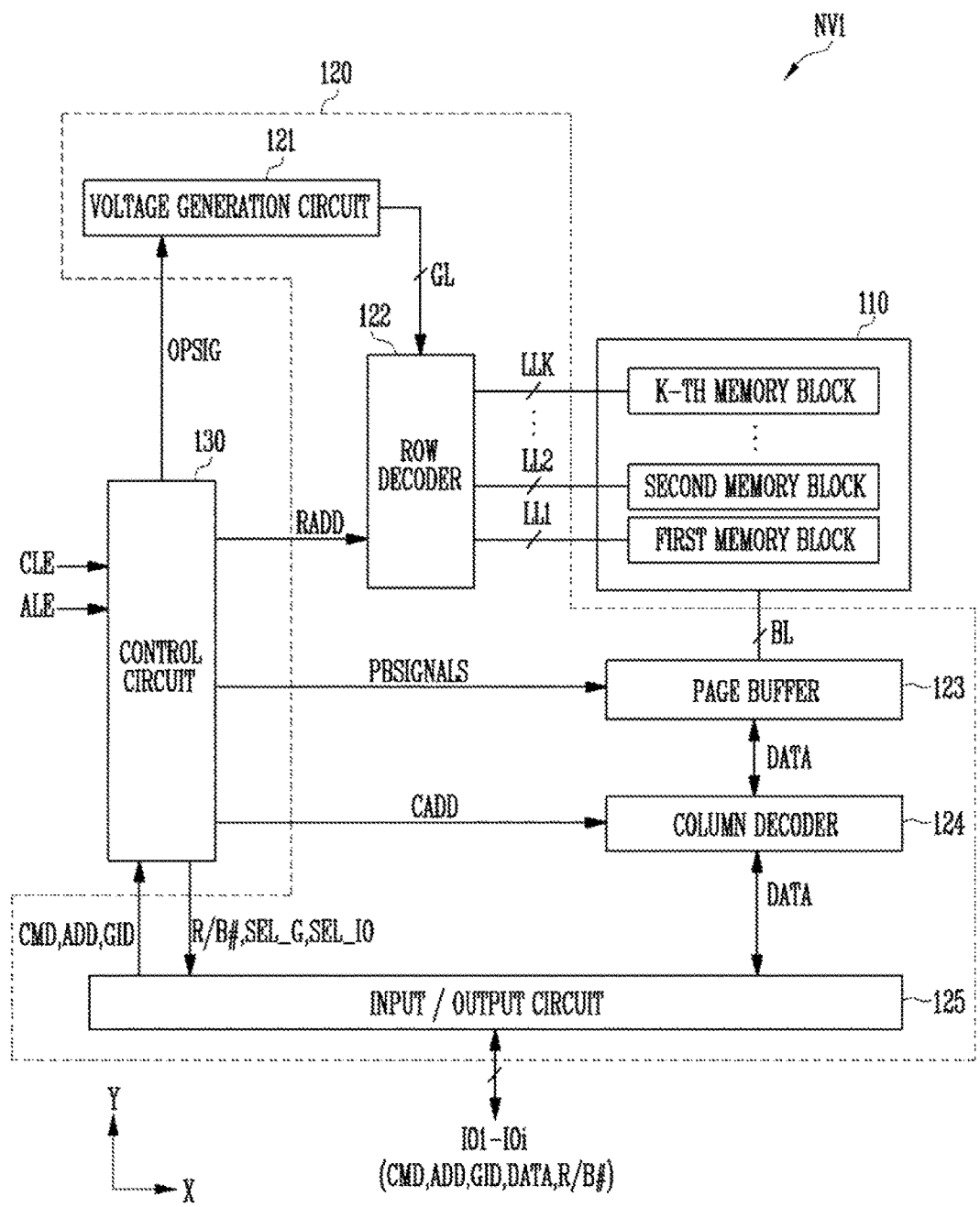
FIG. 5 is a diagram describing an example of a memory chip, according to an embodiment of the present invention.

FIG. 5 describes in detail the first memory chip NV1. It is noted, that the memory chips included in the memory device 1100 may be configured to be similar to each other, and therefore the following description about the first memory chip NV1 will be equally applicable to all the memory chips of the memory device 1100.

Referring now to FIG. 5, the first memory chip NV1 may include a memory cell array 110 in which data are stored, a peripheral circuit 120 configured to perform at least one of a program operation, a read operation, and a deletion operation of the memory cell array 110, and a control circuit 130 configured to control the peripheral circuit 120.

The memory cell array 110 may include first to K—the memory blocks (K is a positive integer) that have the same configuration. The first to K memory blocks may be formed in a two-dimensional or three-dimensional structure. In a two-dimensional structure, memory cells are arranged on a semiconductor substrate in a horizontal direction. In a three-dimensional structure, memory cells are arranged on the semiconductor substrate in a vertical direction, forming a stack of a plurality of memory cell layers.

The peripheral circuit 120 may include a voltage generation circuit 121, a row decoder 122, a page buffer 123, a column decoder 124, and an input/output circuit 125.

The voltage generation circuit 121 may generate various operating voltages in response to an operating signal OPSIG. For example, for a program operation, the voltage generation circuit 121 may generate various operating voltages, such as a program voltage required for the program operation, and a pass voltage, when receiving a program operating signal OPSIG. The operating voltages may be transmitted to a row decoder 122 through global lines (GLs).

The row decoder 122 may select one or more of a plurality of memory blocks of the first to K-th memory blocks and may transfer the operating voltages received through the global lines GLs to local lines LL1 to LLK coupled to the selected one or more memory blocks.

The page buffer 123 may be coupled to the memory cell array 110 through bit lines BL and may pre-charge the bit lines BLs with a positive voltage in response to a page buffer control signal PBSIGNALS or transmit and receive data to and from the selected memory block during the program and read operation or temporarily store the received data.

The column decoder 124 may transfer data DATA between the page buffer 123 and the input/output circuit 125 in response to a column address CADD.

The input/output circuit 125 may receive a command CMD, an address ADD, a group ID GID, and the data DATA from the memory controller 1200, transmit the command CMD, the address ADD, and the group ID GID to the control circuit 130, and transmit the data DATA to the column decoder 124. Further, the input/output circuit 125 may output the ready/busy signal R/B# through the corresponding one of the first to i-th input/output lines IO1 to IOi (e.g., the first input/output line IO1) in response to a ready/busy signal R/B#, group select information SEL_G, and input/output line select information SEL_IO that are received from the control circuit 130.

The control circuit 130 may receive the command CMD in response to the command latch enable signal CLE and receive the address ADD or the group ID GID in response to the address latch enable signal ALE. The control circuit 130 may perform various operations in response to the received command CMD and address ADD.

During a normal operation, the control circuit 130 may output the operating signal OPSIG, a row address RADD, the page buffer control signal PBSIGNALS, and the column address CADD for controlling the peripheral circuit 120 in response to the command CMD and the address ADD corresponding to the program, read, or deletion operation.

During a status check operation, the control circuit 130 may output the ready/busy signal R/B# and the input/output line select information SEL_IO in response to the command CMD provided from the input/output circuit 125 or output the ready/busy signal R/B#, the group select information SEL_G, and the input/output line select information SEL_IO in response to the command CMD and the group ID GID.

In a memory system in which the number of memory chips coupled to the channel is smaller than a reference number, the control circuit 130 may output the ready/busy signal R/B# and the input/output line select information SEL_IO in response to the command CMD. Alternatively, in a memory system in which the number of memory chips coupled to the channel is equal to or larger than the reference number, the control circuit 130 may output the ready/busy signal R/B#, the group select information SEL_G, and the input/output line select information SEL_IO in response to the command CMD and the group ID GID. The reference number may be differently set depending on the memory system. When the memory chips coupled to the channel are divided into a plurality of memory groups, the group ID GID includes the group select information for performing the status check operations of the memory chips included in the selected group.

Further, the control circuit 130 may store the status information on the first memory chip NV1. During the status check operation, the control circuit 130 may output the stored status information as the ready/busy signal R/B#. The status information may be continuously updated depending on the operation of the first memory chip NV1. For example, the status information may have a value '1' or '0' depending on the operation status of the first memory chip NV1. If the first memory chip NV1 is ready to perform a new operation, the status information may have the value '1' representing a ready status. If the first memory chip NV1 is performing a specific operation, the status information may have the value '0' representing a busy status.

Figure 6:
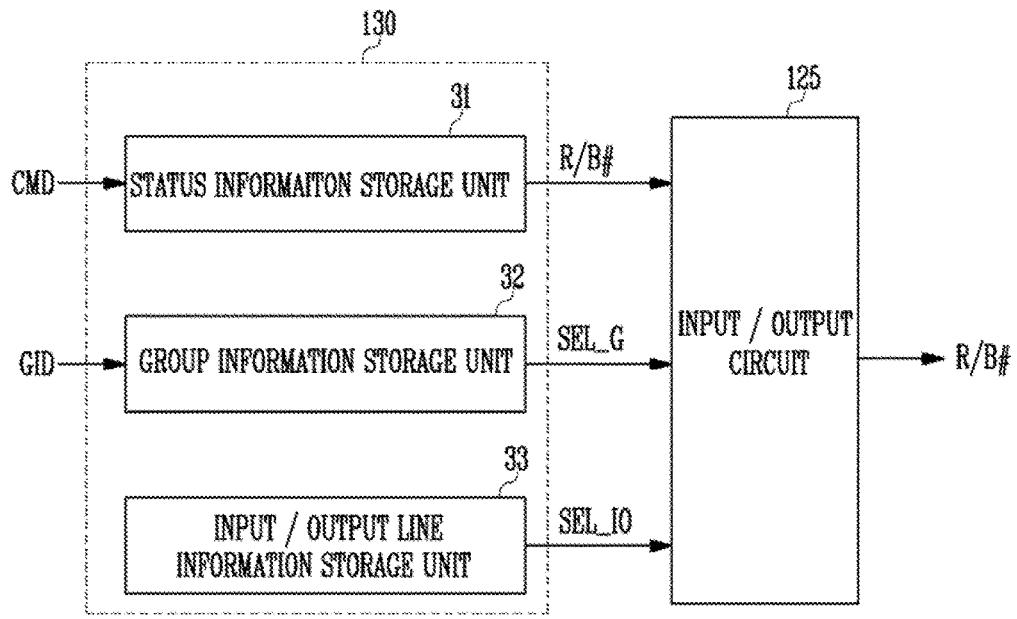
FIG. 6 is a diagram describing an example configuration of the control circuit of FIG. 5.

Referring to FIG. 6, the control circuit 130 may include a status information storage unit 31 storing the status information and an input/output line information storage unit 33. Further, when the memory chips are divided into a plurality of memory groups, the control circuit 130 may further include a group information storage unit 32.

The status information storage unit 31 may store the status information representing the operation state of the corresponding memory chip. The state information may have the value of '0' or '1' as described in FIG. 5 and may be continuously updated depending on the operation state of the memory chip. The status information storage unit 31 may output the stored status information as the ready/busy signal R/B# in response to the command CMD for the status check operation.

The group information storage unit 32 may store group information of the corresponding memory chip and output the group information as the group select information SEL_G in response to the group ID GID. For example, if the first memory chip NV1 is included in a first memory group, the group information may have a value '0' and if the first memory chip NV1 is included in a second memory group, the group information may have a value '1'. During the status check operation, the group information storage unit 32 may determine whether the group ID GID and the group information coincide with each other and output the group select information SEL_G depending on the determined result.

The input/output line information storage unit 33 may store the information on the input/output line of the corresponding memory chip. For example, during the status check operation, when the first memory chip NV1 is set to correspond to the first input/output line IO1, the input/output line information storage unit 33 of the first memory chip NV1 may include input/output information on the first input/output line and output the stored input/output line information as the input/output line select information SEL_IO.

The input/output circuit 125 may output the ready/busy signal R/B# in response to the ready/busy signal R/B# and the input/output line select information SEL_IO. Alternatively, when the memory chips are divided into a plurality of memory groups, the input/output circuit 125 may output the ready/busy signal R/B# in response to the ready/busy signal R/B#, the group select information SEL_G, and the input/output line select information SEL_IO. For example, the input/output circuit 125 may output the ready/busy signal R/B# through the selected input/output line in response to the input/output line select information SEL_IO. Further, when using the group select information SEL_G, the input/output circuit 125 may determine whether to output the ready/busy signal R/B# through the selected input/output line in response to the group select information SEL_G. For example, when a target memory chip of the status check operation is not the group in which the first memory chip NV1 is included, the input/output circuit 125 does not output the ready/busy signal R/B# through the selected input/output line in response to the group select information SEL_G. When the target memory chip of the status check operation is the group in which the first memory chip NV1 is included, the input/output circuit 125 outputs the ready/busy signal R/B# through the selected input/output line in response to the group select information SEL_G.

How to perform the status check operations through the input/output lines will be described below in detail.

Figure 7:
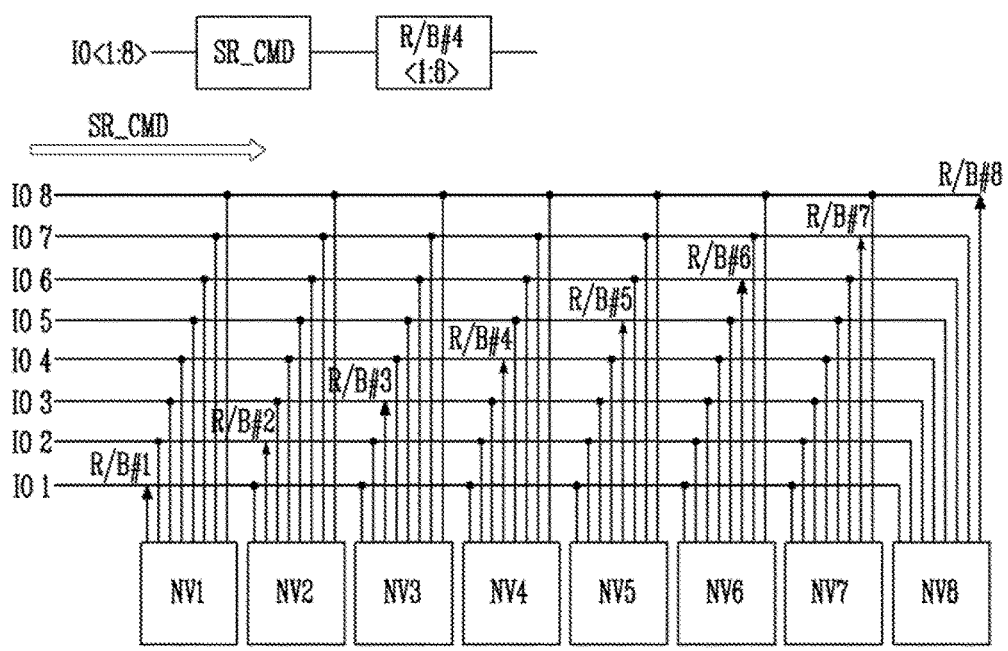
FIG. 7 is a diagram describing a status check operation of memory chips, according to an embodiment of the present invention.

FIG. 7 is a diagram describing status check operations of the memory chips, according to an embodiment of the present invention.

Referring to FIG. 7, an example for illustration purposes, first to eighth input/output lines IO<1:8> and first to eighth memory chips NV1 to NV8 will be described by way of example. However, we note, that the number of input/output lines and memory chips may be different depending on the memory system.

A status check command SR_CMD is commonly transmitted to the first to eighth memory chips NV1 to NV8 through the first to eight input/output lines IO<1:8>. According to the present embodiment, the status check operations of all the memory chips NV1 to NV8 coupled to one channel are simultaneously performed, and therefore the chip enable signals may or may not be transmitted to the first to eighth memory chips NV1 to NV8. To shorten the status check operationtime, it is preferable not to transmit the chip enable signals to the first to eighth memory chips NV1 to NV8. The first to eighth memory chips NV1 to NV8 may simultaneously output the first to eighth ready/busy signals R/B#<1:8> respectively through the first to eighth input/output lines IO<1:8> in response to the status check command SR_CMD. Describing in detail, the first memory chip NV1 may be set to output the first ready/busy signal R/B#<1> through the first input/output line IO<1> and the second memory chip NV2 may be set to output the second ready/busy signal R/B#<2> through the second input/output line IO<2>. In this way, the first to eighth memory chips NV1 to NV8 may simultaneously output the first to eighth ready/busy signals R/B#<1:8> respectively through the first to eighth input/output lines IO<1:8>.

The memory controller 1200 may determine the operation state of the first to eighth memory chips NV1 to NV8 according to the first to eighth ready/busy signals R/B#<1:8> respectively provided through the first to eighth input/output lines IO<1:8>. The memory controller 1200 may determine the operation status of the first to eighth memory chips NV1 to NV8 and then transmit commands for subsequent operations to one or more available memory chips among the first to eighth memory chips NV1 to NV8. The memory controller 1200 may enable the chip enable signal of the available memory chip for selecting the available memory chip and transmit the command for the subsequent operations to the selected memory chip.

Figure 8:
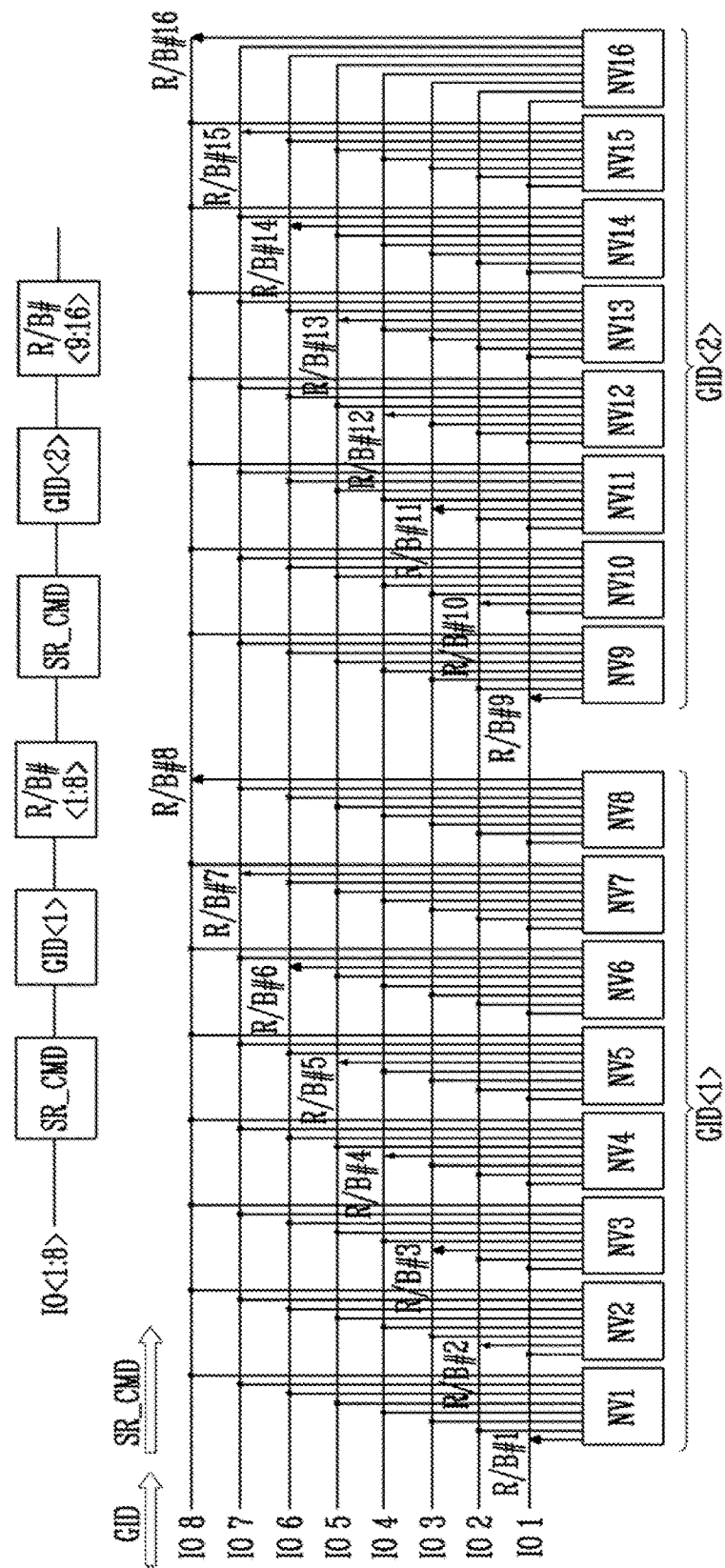
FIG. 8 is a diagram describing a status check operation of memory chips, according to another embodiment of the present invention.

FIG. 8 is a diagram describing status check operations of memory chips, according to another embodiment of the present invention, and illustrates a status check operation when the number of memory chips is larger than the number of input/output lines.

Referring to FIG. 8, when first to sixteenth memory chips NV1 to NV16 are coupled to the first to eighth input/output lines IO<1:8>, the first to sixteenth memory chips NV1 to NV16 may be divided into plural memory groups (e.g., two memory groups) and operate as a group unit. According to the present embodiment, the status check operations of the memory chips coupled to the first to eighth input/output lines IO<1:8> are simultaneously performed by the group unit, and therefore all the chip enable signals may be disabled or enabled. To shorten the status check operation time, it is preferable to disable all the chip enable signals. For example, the first to eighth memory chips NV1 to NV8 may be included in the first memory group and a ninth to sixteenth memory chips NV9 to NV16 may be included in the second memory group. The first memory group and the second memory group may be distinguished from each other by using the group ID GID, and therefore the group may be selected even though the chip enable signals are disabled. A first memory group ID GID<1> may be allocated to the first memory group and a second memory group ID GID<2> may be allocated to the second memory group. For example, if the memory controller 1200 outputs the first memory group ID GIF<1>, the first to eighth memory chips NV1 to NV8 included in the first memory group may output the first to eighth ready/busy signals R/B#<1:8>. In this case, the ninth to sixteenth memory chips NV9 to NV16 included in the second memory group do not output the ninth to sixteenth ready/busy signals R/B#<9:16>. This will be described below in more detail.

During the status check operation, the memory controller 1200 commonly transmits the status check command SR_CMD to the first to sixteenth memory chips NV1 to NV16 through the first to eighth input/output lines IO<1:8> and then transmits the group ID GID. When the first memory group is selected and then the second memory group is selected, for example, the memory controller 1200 outputs the status check command SR_CMD through the first to eighth input/output lines IO<1:8>. The first to sixteenth memory chips NV1 to NV16 commonly receive the status check command SR_CMD and is ready to perform the status check operation.

Next, the memory controller 1200 outputs the first memory group ID GID<1> for selecting the first memory group through the first to eighth input/output lines IO<1:8>. The first to eighth memory chips NV1 to NV8 included in the first memory group are selected by the first memory group ID GID<1> while the ninth to sixteenth memory chips NV9 to NV16 included in the second memory group are not selected.

The selected first to eighth memory chips NV1 to NV8 output the ready/busy signals through the first to eighth input/output lines IO<1:8>, respectively. For example, the first memory chip NV1 outputs the first ready/busy signal R/B#<1> through the first input/output line IO<1> and the second memory chip NV2 outputs the second ready/busy signal R/B#<2> through the second input/output line IO<2>. In this way, each of the third to eighth memory chips NV3 to NV8 may also output the third to eighth ready/busy signals R/B#<3:8> through the third to eighth input/output lines IO<3:8>, respectively.

The memory controller 1200 receives the first to eighth ready/busy signals R/B#<1:8> of the first memory group transmitted through the first to eighth input/output lines IO<1:8> and then sequentially outputs the status check command SR_CMD and the second memory group ID GID<2> through the first to eighth input/output lines IO<1:8> for the status check operation of the second memory group. Then the ninth to sixteenth memory chips NV9 to NV16 included in the second memory group are selected by the second memory group ID GID<2> while the first to eighth memory chips NV1 to NV8 included in the first memory group are not selected. The selected ninth to sixteenth memory chips NV9 to NV16 output the ready/busy signals through the first to eighth input/output lines IO<1:8>, respectively. For example, the ninth memory chip NV9 outputs the ninth ready/busy signal R/B#<9> through the first input/output line IO<1> and the tenth memory chip NV10 outputs the tenth ready/busy signal R/B#<10> through the second input/output line IO<2>. In this way, each of the eleventh to sixteenth memory chips NV11 to NV16 may also output the eleventh to sixteenth ready/busy signals R/B#<11:16> through the third to eighth input/output lines IO<3:8>, respectively.

As described above, even though the number of memory chips is larger than the number of input/output lines, the memory chips may be grouped and the status check operations of the memory chips for each selected group may be simultaneously performed. Therefore, even though the number of memory chips is large, the status check operation time may be shortened.

Figure 9:
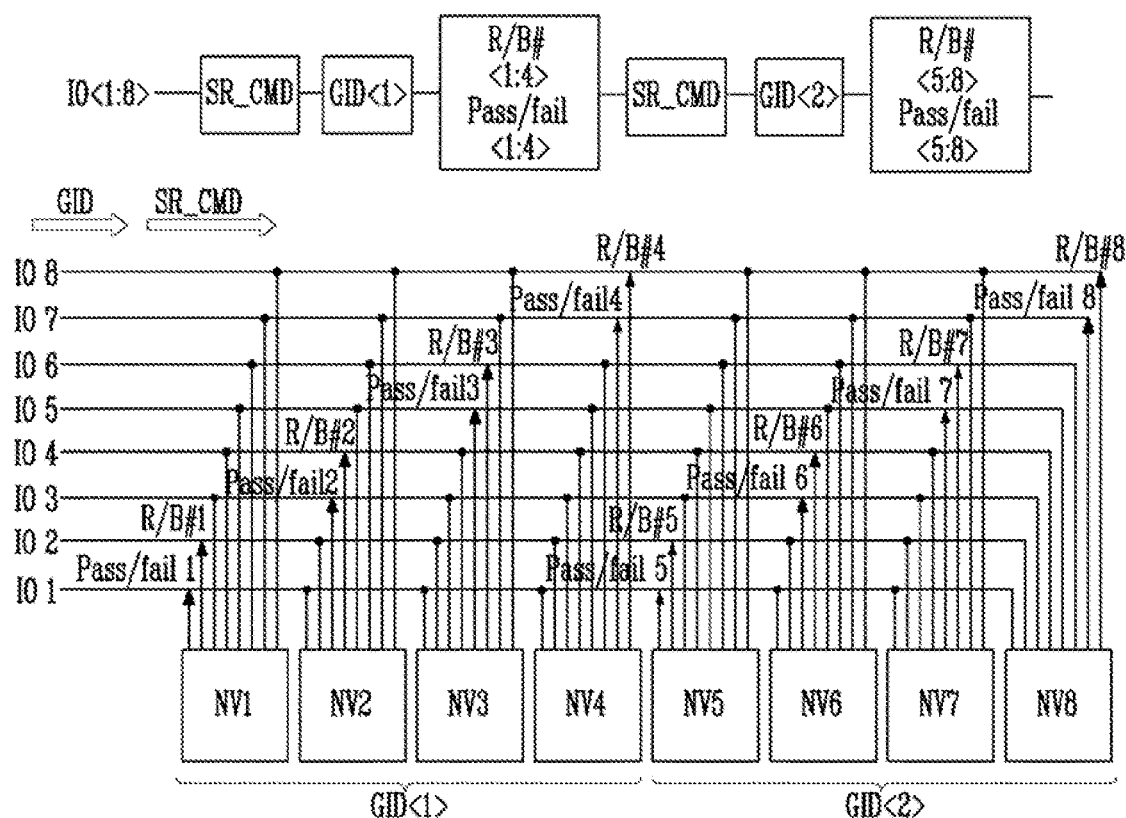
FIG. 9 is a diagram describing a status check operation of memory chips, according to still another embodiment of the present invention.

FIG. 9 is a diagram describing status check operations of memory chips according to still another embodiment of the present invention, and illustrates an operation of transmitting the status operations and operation results of the respective memory chips through the input/output lines.

Referring to FIG. 9, when first to eighth memory chips NV1 to NV8 are coupled to the first to eighth input/output lines IO<1:8>, the first to eighth memory chips NV1 to NV8 may be divided into plural memory groups (e.g., two memory groups). The first to eighth memory chips NV1 to NV8 may simultaneously output pass/fail signals Pass/Fail<1:8> for the operation results of the respective memory chips along with the first to eighth ready/busy signals R/B#<1:8> during the state check operation. According to the present embodiment, the status checks operations of the memory chips NV1 to NV8 coupled to the first to eighth input/output lines IO<1:8> are simultaneously performed as a group unit, and therefore all the chip enable signals may be disabled or enabled. To shorten the status check operation time, it is preferable to disable all the chip enable signals. The pass/fail signals Pass/Fail<1:8> may represent the pass/fail of the various operations performed by the first to eighth memory chips NV1 to NV8. When the first to eighth memory chips NV1 to NV8 are coupled to the first to eighth input/output lines IO<1:8>, at least two input/output lines need to be allocated to the respective memory chips for the memory chip to simultaneously output the ready/busy signals and the pass/fail signals. For example, the first and second input/output lines IO<1:2> may be allocated to the first memory chip NV1, the third and fourth input/output lines IO<34> may be allocated to the second memory chip NV2, the fifth and sixth input/output lines IO<5:6> may be allocated to the third memory chip NV3, and the seventh and eighth input/output lines IO<7:8> may be allocated to the fourth memory chip NV4. In this case, the number of input/output lines allocated to the rest fifth to eighth memory chips NV5 to NV8 is insufficient, and therefore the memory chips are grouped and operate as a group unit. This will be described below in more detail.

The first to fourth memory chips NV1 to NV4 may be included in the first memory group and the fifth to eighth memory chips NV5 to NV8 may be included in the second memory group. The first memory group and the second memory group may be distinguished from each other by using the group ID GID. The first memory group ID GID<1> may be allocated to the first memory group and the second memory group ID GID<2> may be allocated to the second memory group. For example, if the memory controller 1200 outputs the first memory group ID GIF<1>, the first to fourth memory chips NV1 to NV4 included in the first memory group may be selected while the fifth to eighth memory chips NV5 to NV8 included in the second memory group may not be selected. For example, the memory controller 1200 may simultaneously transmit the status check command SR_CMD to the first to eighth memory chips NV1 to NV8 through the first to eighth input/output lines IO<1:8> and then transmit the group ID GID. When the first memory group is selected and then the second memory group is selected, for example, the memory controller 1200 outputs the status check command SR_CMD to the first to eighth input/output lines IO<1:8>. The first to eighth memory chips NV1 to NV8 commonly receive the status check command SR_CMD and are ready to perform the status check operation.

Next, the memory controller 1200 outputs the first memory group ID GID<1> for selecting the first memory group through the first to eighth input/output lines IO<1:8>. The first to fourth memory chips NV1 to NV4 included in the first memory group are selected by the first memory group ID GID<1> while the fifth to eighth memory chips NV5 to NV8 included in the second memory group are not selected.

The selected first to fourth memory chips NV1 to NV4 output the ready/busy signals and the pass/fail signals through the allocated input/output lines, respectively, among the first to eighth input/output lines IO<1:8>. For example, the first memory chip NV1 may output the first pass/fail signal Pass/Fail<1> through the first input/output line IO<1> and output the first ready/busy signal R/B#<1> through the second input/output line IO<2>. The second memory chip NV2 may output the second pass/fail signal Pass/Fail<2> through the third input/output line IO<3> and output the second ready/busy signal R/B#<2> through the fourth input/output line IO<4>. The third memory chip NV3 may output the third pass/fail signal Pass/Fail<3> through the fifth input/output line IO<5> and output the third ready/busy signal R/B#<3> through the sixth input/output line IO<6>. The fourth memory chip NV4 may output the fourth pass/fail signal Pass/Fail<4> through the seventh input/output line IO<7> and output the fourth ready/busy signal R/B#<4> through the eighth input/output line IO<8>.

The memory controller 1200 receives the first to fourth pass/fail signals Pass/Fail<1:4> and the first to fourth ready/busy signals R/B#<1:4> of the first memory group transmitted through the first to eighth input/output lines IO<1:8>, stores the operation status and the information on the pass/fail result of the operation of the respective memory chips of the first memory group, and then sequentially outputs the status check command SR_CMD and the second memory group ID GID<2> through the first to eighth input/output lines IO<1:8> for the status check operation of the second memory group. The fifth to eighth memory chips NV5 to NV8 included in the second memory group are selected by the second memory group ID GID<2> while the first to fourth memory chips NV1 to NV4 included in the first memory group are not selected. The selected fifth to eighth memory chips NV5 to NV8 output the pass/fail signals and the ready/busy signals through the allocated input/output lines, respectively, among the first to eighth input/output lines IO<1:8>. For example, the fifth memory chip NV5 may output the fifth pass/fail signal Pass/Fail<5> through the first input/output line IO<1> and output the fifth ready/busy signal R/B#<5> through the second input/output line IO<2>. The sixth memory chip NV6 may output the sixth pass/fail signal Pass/Fail<6> through the third input/output line IO<3> and output the sixth ready/busy signal R/B#<6> through the fourth input/output line IO<4>. The seventh memory chip NV7 may output the seventh pass/fail signal Pass/Fail<7> through the fifth input/output line IO<5> and output the seventh ready/busy signal R/B#<7> through the sixth input/output line IO<6>. The eighth memory chip NV8 may output the eighth pass/fail signal Pass/Fail<8> through the seventh input/output line IO<7> and output the eighth ready/busy signal R/B#<8> through the eighth input/output line IO<8>.

As described above, the memory controller 1200 may store the operation statuses and the pass/fail information on the respective memory chips and if the status check operations of all the memory chips end, the operable memory chips may be selected depending on the stored information. Next, the memory controller 1200 may sequentially transmit commands of the subsequent operations to the selected memory chips depending on a command queue for the subsequent operation of the operable memory chips. For example, the memory controller 1200 may transmit commands for new operations to the memory chips in which the current operation passes among the operable memory chips and transmit commands for repeating the current operation to the memory chips in which the current operation fails until the current operation passes.

As described above, even though the number of signals simultaneously transmitted from the memory chips is larger than the number of input/output lines, the memory chips may be grouped and the status check operations of the memory chips for each selected group may be simultaneously performed. Therefore, even though the number of signals simultaneously transmitted from memory chips is large, the status check operation time may be shortened.

Figure 10:
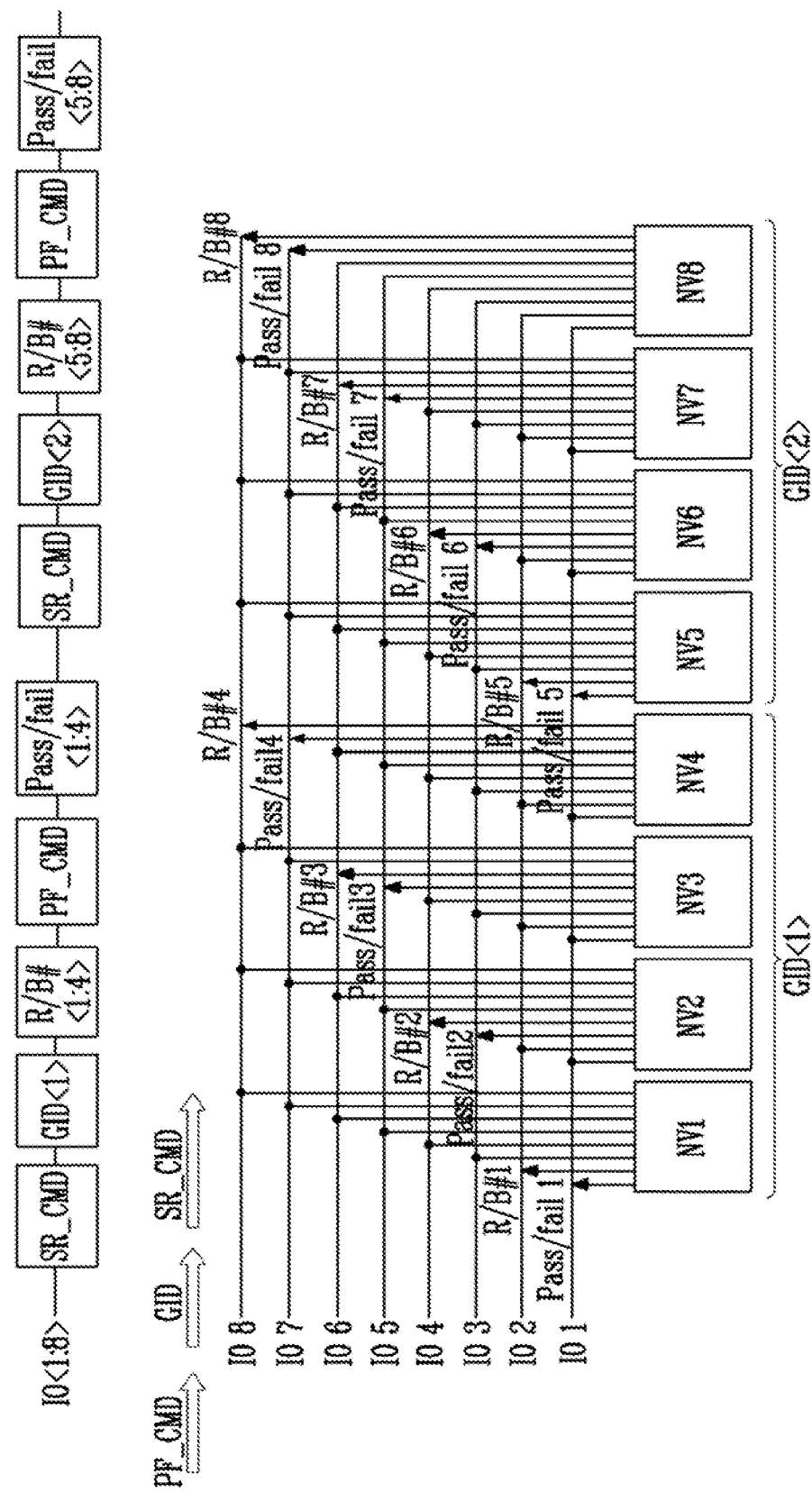
FIG. 10 is a diagram describing a status check operation of memory chips, according to yet another embodiment of the present invention.

FIG. 10 is a diagram describing status check operations of memory chips, according to yet another embodiment of the present invention. According to the embodiment described with reference to FIG. 9, the ready/busy signals and the pass/fail signals are simultaneously transmitted in response to the status check command, but according to the embodiment described with reference to FIG. 10, the pass/fail signals may be selectively transmitted.

Referring to FIG. 10, when first to eighth memory chips NV1 to NV8 are coupled to the first to eighth input/output lines IO<1:8>, the first to eighth memory chips NV1 to NV8 may be divided into plural memory groups, for example, into two memory groups. The status check operations of the memory chips coupled to the first to eighth input/output lines IO<1:8> may be simultaneously performed in the group unit, and therefore all the chip enable signals may be disabled or enabled. To shorten the status check operation time, it is preferable to disable all the chip enable signals. As described with reference to FIG. 9, according to the present embodiment, at least two input/output lines may be allocated to each memory chip and the memory chips may be operated in the group unit.

For the status check operations of the first to fourth memory chips NV1 to NV4 included in the selected first memory group, the memory controller 1200 commonly transmits the status check command SR_CMD to the first to eighth memory chips NV1 to NV8 through the first to eighth input/output lines IO<1:8> and then transmits the group ID GID. Hereinafter, the case in which the first memory group is selected and then the second memory group is selected will be described by way of example.

The memory controller 1200 outputs the status check command SR_CMD to the first to eighth input/output lines IO<1:8>. The first to eighth memory chips NV1 to NV8 commonly receive the status check command SR_CMD and is ready to perform the status check operation. Next, the memory controller 1200 outputs the first memory group ID GID<1> for selecting the first to fourth memory chips NV1 to NV4 included in the first memory group through the first to eighth input/output lines IO<1:8>. The first to fourth memory chips NV1 to NV4 included in the first memory group are selected by the first memory group ID GID<1> while the fifth to eighth memory chips NV5 to NV8 included in the second memory group are not selected.

The selected first to fourth memory chips outputs the ready/busy signals R/B#<1>, R/B#<2>, R/B#<3>, and R/B#<4> through the allocated input/output lines IO<2>, IO<4>, IO<6>, and IO<8>, respectively, among the first to eighth input/output lines IO<1:8>. In the embodiment of FIG. 9 as described above, the memory chips are set to simultaneously output the ready/busy signals and the pass/fail signals, but in the embodiment of FIG. 10, the memory chips may be set to output only the ready/busy signals in response to the status check command and output the pass/fail signals in response to the pass/fail check command. This may be set by changing design of the control circuit 130 included in the memory chips.

The memory controller 1200 receives the ready/busy signals R/B#<1>, R/B#<2>, R/B#<3>, and R/B#<4> through the first to eighth input/output lines IO<1:8> and determines which memory chip in the first memory group is available. Here, among the memory chips currently determined as available, some of them may also be previously determined as available while some of them may be previously determined as busy and currently determined as available. When all the memory chips of the selected first memory group are in a busy state, the memory controller 1200 may end the status check operation without a pass/fail check operation. If there are one or more available memory chips in the selected first memory group, the memory controller 1200 outputs a pass/fail check command PF_CMD through the input/output lines IO<1:8> to perform the pass/fail check operation. The available memory chips among the first to fourth memory chips NV1 to NV4 included in the first memory group output the pass/fail signals in response to the pass/fail check command PF_CMD. In this case, the memory chips in the busy state may output the fail signals.

The memory controller 1200 stores the pass/fail information on the first to fourth memory chips NV1 to NV4 included in the first memory group and then may sequentially perform the status check operations and the pass/fail check operations of the fifth to eighth memory chips NV5 to NV8 included in the second memory group by changing the group ID from the first memory group ID GID<1> to the second memory group ID GID<2>.

The memory controller 1200 may control the memory chips for subsequent operations depending on the pass/fail information on the first to eighth memory chips NV1 to NV8.

As described above, without a dedicated line onto which the ready/busy signal R/B# for determining the status of the memory chips is loaded, the input/output lines may be employed for reducing a channel area of the memory system. Moreover, the status of the plurality of memory chips may be simultaneously determined, and therefore a polling operation time of the memory system may be shortened. Further, the embodiments described with reference to FIGS. 7 to 10 may be used alone or in a combination thereof.

Figure 11:
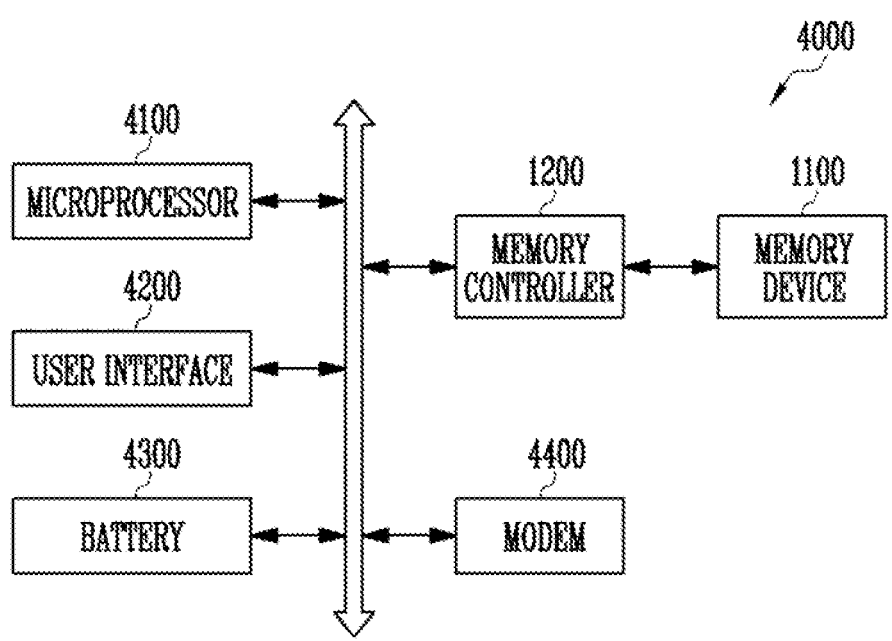
FIG. 11 is a diagram describing a computing system including a memory system, according to an embodiment of the present invention.

FIG. 11 is a diagram describing a schematic configuration of a computing system, including a memory system, according to an embodiment of the present invention.

Referring to FIG. 11, a memory system 4000 according to an embodiment of the present invention may include the memory device 1110, the memory controller 1200, a microprocessor 4100, a user interface 4200, and a modem 4400 that are electrically coupled to a bus. Further, when the memory system 4000 according to the embodiment of the present invention is a mobile device, the memory system 4000 may further include a battery 4300 for supplying an operating voltage of the memory system 4000. Although not illustrated in FIG. 11, the memory system 4000 according to an embodiment of the present invention may further include an application chip set, a camera image processor (CIS), a mobile DRAM, etc. The memory controller 1200 and the memory device 1110 may configure a solid state drive/disk.

The memory system 4000 according to an embodiment of the present invention may be mounted using various types of packages. For example, the memory system 4000 may be mounted using packages such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a system in package (SIP), a multi chip package (MCP), a wafer-level fabricated package (WFP), a wafer-level processed stack package (WSP), and the like.

The present technology can reduce the size of the channel coupled between the memory controller and the memory chips and shorten the status check operating time understanding the status of the memory chips. As a result, it is possible to reduce the size of the memory system and increase its operating speed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A memory system, comprising:
a memory chip configured to output a ready/busy signal through a corresponding input/output line among a plurality of input/output lines in response to a status check command; and
a memory controller configured to transmit the status check command to the memory chip through the corresponding input/output line and determine an operation status of the memory chip according to the ready/busy signal,
wherein the corresponding input/output line through which the status check command is transmitted and the ready/busy signal is outputted is the same as a line through which a command, and an address are transmitted, and
wherein the command and the address are used to perform one of a program operation, a read operation, and an erase operation on memory cells.
2. The memory system according to claim 1, wherein the memory chip includes:
a status information storage unit configured to output status information of the memory chip as the ready/busy signal in response to the status check command; and
an input/output circuit configured to transmit the ready/busy signal to the memory controller through the corresponding input/output line.

3. The memory system according to claim 1, wherein the memory chip transmits data to the memory controller through the corresponding input/output line.

4. The memory system according to claim 1, wherein the memory chip outputs a pass/fail signal simultaneously with the ready/busy signal through a corresponding pair among the input/output lines in response to the status check command.

5. The memory system according to claim 4, wherein the memory controller determines the status of the memory chip according to the ready/busy signal and the pass/fail signal.

6. The memory system according to claim 1, wherein the memory controller transmits a pass/fail check command for determining an operation result of the memory chip to the memory chip through the corresponding input/output line in response to the ready/busy signal.

7. The memory system according to claim 6, wherein the memory chip transmits a pass/fail signal according to the operation result to the memory controller through the corresponding input/output line in response to the pass/fail check command.

8. A memory system, comprising:
a plurality of memory chips coupled to a plurality of input/output lines included in a channel, respectively, and configured to output ready/busy signals through the input/output lines, respectively, in response to a status check command; and
a memory controller configured to transmit the status check command to the memory chips through the input/output lines included in the channel, and determine operation statuses of the memory chips according to the ready/busy signals outputted from the memory chips,
wherein the input/output lines through which the status check command is transmitted and the ready/busy signals are outputted are the same as lines through which a command and an address are transmitted, and
wherein the command and the address are used to perform one of a program operation, a read operation, and an erase operation on memory cells.

9. The memory system according to claim 8, wherein the memory chips are commonly coupled to the input/output lines.

10. The memory system according to claim 8, wherein each of the memory chips includes:
a status information storage unit configured to output status information of a corresponding memory chip as a ready/busy signal in response to the status check command;
an input/output line information storage unit configured to output input/output line information of the corresponding memory chip; and
an input/output circuit configured to transmit the ready/busy signal through the input/output line of the corresponding memory chip according to the input/output line information.

11. The memory system according to claim 8, wherein the channel further includes:
a command latch line configured to transfer a command latch enable signal, wherein the memory chips are commonly coupled to the command latch line; and
an address latch line configured to transfer an address latch enable signal, wherein the memory chips are commonly coupled to the address latch line.

12. The memory system according to claim 11, wherein the memory controller provides the status check command to the memory chips during enablement of the command latch enable signal, and simultaneously receives the ready/busy signals output from the memory chips.

13. A memory system, comprising:
a plurality of memory groups including a plurality of memory chips coupled to a plurality of input/output lines, respectively, and configured to selectively output ready/busy signals of the memory chips included therein through the input/output lines, respectively; and
a memory controller configured to simultaneously determine operating statuses of the memory chips according to the ready/busy signals outputted from each of the memory groups,
wherein the input/output lines through which the ready/busy signals are outputted are the same as lines through which a command and an address are transmitted, and
wherein the command and the address are used to perform one of a program operation, a read operation, and an erase operation on memory cells.

14. The memory system according to claim 13, wherein each of the memory chips includes:
a status information storage unit configured to output status information of a corresponding memory chip as a ready/busy signal in response to a status check command provided from the memory controller;
a group information storage unit configured to store group information of the corresponding memory chip, and compare a group ID, which represents a selected one among the plurality of the memory groups and is provided along with the status check command from the memory controller, with the group information in order to output the group information as group select information;
an input/output line information storage unit configured to output input/output line information of the corresponding memory chip; and
an input/output circuit configured to transmit the ready/busy signal through an input/output line of the corresponding memory chip according to the input/output line information and the group select information.

15. The memory system according to claim 14, wherein the input/output circuit outputs the ready/busy signal of the corresponding memory chip through the input/output line of the corresponding memory chip according to the group select information.

16. The memory system according to claim 14, wherein the memory controller outputs the group ID through the input/output lines, and determines the operation statuses of the memory chips corresponding to the group ID according to the ready/busy signals provided from a memory group corresponding to the group ID.

17. The memory system according to claim 14, wherein each of the memory chips outputs a pass/fail signal, which represents an operation result of the corresponding memory chip, along with the ready/busy signal of the corresponding memory chip through the input/output line of the corresponding memory chip.

18. The memory system according to claim 17, wherein the memory controller transmits a pass/fail check command requesting the pass/fail signal to the memory chips through the input/output lines in response to the ready/busy signals provided from each of the memory groups.

19. The memory system according to claim 18, wherein a memory chip of a busy state outputs fail signals.

* * * * *